United States Patent [19]

Haulin

[11] Patent Number: 4,484,145
[45] Date of Patent: Nov. 20, 1984

[54] PULSE WIDTH MODULATED POWER AMPLIFIER

[75] Inventor: Tord L. Haulin, Hammarbyg, Sweden

[73] Assignee: Telefonaktiebolaget L M Ericsson, Stockholm, Sweden

[21] Appl. No.: 405,957

[22] PCT Filed: Dec. 8, 1981

[86] PCT No.: PCT/SE81/00361
§ 371 Date: Jul. 29, 1982
§ 102(e) Date: Jul. 29, 1982

[87] PCT Pub. No.: WO82/02294
PCT Pub. Date: Jul. 8, 1982

[30] Foreign Application Priority Data

Dec. 19, 1980 [SE] Sweden ............................. 8008988

[51] Int. Cl.³ ............................................. H03F 3/38
[52] U.S. Cl. .......................................... 330/9; 330/10
[58] Field of Search ................. 330/9, 10, 207 A, 251; 179/18 HB, 70, 77

[56] References Cited

U.S. PATENT DOCUMENTS 4,192,975  3/1980  Brockmann ............... 179/18 HB X

FOREIGN PATENT DOCUMENTS 2020505  11/1979  United Kingdom ................. 330/10

Primary Examiner—James B. Mullins
Attorney, Agent, or Firm—Roberts, Spiecens & Cohen

[57] ABSTRACT

A pulse width modulated power amplifier has a power section containing a transformer (T) with four windings. The windings ($L_1$, $L_2$) on the battery side are each connected by their end points to switch pairs ($P_{fa}$, $P_{rb}$ and $P_{fb}$, $P_{ra}$) where each switch pair can conduct current in both directions. The windings ($L_3$, $L_4$) on the load side are adapted in the same way, with their end points connected to switch pairs ($S_{1a}$, $S_{2b}$ and $S_{1b}$, $S_{2a}$), where each pair can conduct current in both directions. Input and output filters (IF and UF) are connected to the battery and load sides, respectively. The output voltage from the output filter (UF) is compared with the incoming signal ($U_r$) which is to be amplified, and the error signal ($U_f$) thus formed controls a pulse length modulator (PM), which sends control signals to the switch pairs.

4 Claims, 3 Drawing Figures

PULSE WIDTH MODULATED POWER AMPLIFIER

TECHNICAL FIELD

The invention relates to a pulse width modulated power amplifier for amplifying the current and/or voltage level of an input signal and more particularly to an amplifier which can amplify input signals having a frequency range from 0 Hz (direct voltage) up to a maximum frequency related to the clock frequency generated in, or applied to the amplifier. Such an amplifier can be used as a power amplifier for signals, preferably within the audio band and therebelow, and as a transmitting step in an electronic line connection circuit in telephony and thereby provide the subscriber line with a speech modulated DC supply. (It can also be used as a ringing signal generator for telephone exchanges.)

BACKGROUND ART

Resistors have been previously used in supplying current to line circuits in telephony, these resistors being connected to a direct voltage source (usually −48 V), speech modulation being executed with the aid of a transformer (the speech transformer), as will be seen from the U.S. Pat. No. 4,056,689, for example. Linear amplifiers are used alternatively for the same purpose, a so-called class S amplifier described in "Circuits and Systems" IEEE, Volume 7, No. 10, December 1975.

DISCLOSURE OF THE INVENTION

In the current supply of a subscriber line via resistors, power is developed in the form of heat in the current supply resistor. The speech transformer must take care of the DC magnetization from the current supply, apart from the low frequency speech band signals, which results in it becoming unnecessarily large and heavy. This transformer is eliminated in line circuits with linear end stages, but the high power loss remains, thus the components unable to be fitted closer on the circuit board, even if their physical dimensions were to allow it. The introduction of a class D type amplifier eliminates the problem with the speech transformer, but as with the above mentioned case, the output voltage is here limited to the supply voltage, thus requiring a DC converter for ringing signal generation, and for current supply in some cases as well. The amplifier in accordance with the present invention is a variant of the converter described in the Swedish Patent application No. 8008633-3. The present amplifier contains, as is described in said patent application, a transformer to which controllable or steerable switching devices are connected on both battery and load sides. These switching devices are mutually connected and steered so that energy can be transferred from the voltage supply input ("battery side") to its output ("load side") as well as from the load side to the battery side. Contrary to the switching devices in the converter according to the above-mentioned patent application, the switching devices are two-way, so that the transport of energy takes place in two directions during each clock pulse interval. The energy transfer takes place in different ways depending on the signal polarity, which results in four different operational modes.

When the amplifier is in operation, the switching devices are energized in pairs, one on the battery side and one on the load side. This gives rise to four different combinations, one for each operational mode. The energized switches are opened and closed at a fixed switching frequency controlled by a clock signal. The pulse-pause relationship for the energized switches is controlled by a pulse width modulator, in turn controlled by an error voltage derived from the amplifier output voltage and a reference voltage. Energy is thus always transferred (at every instant) in the amplifier between the battery and load sides. Each clock period of the supplied clock signal is divided by the pulse width modulation into two time intervals during which the energy transport takes place in each direction. The output and input filters included in the amplifier have the task of smoothing the pulsing (mean value formation), so that the energy flow, i.e., the difference between energy fed to, and from battery and load does not vary appreciably in time with the clock frequency. In this mode the analogue signal which is desired to be amplified is regenerated from the pulse width modulated intermediate form.

BRIEF DESCRIPTION OF DRAWINGS

The invention will now be described in detail while referring to the accompanying drawings, where.

MODES FOR CARRYING OUT THE INVENTION

Figure 1:
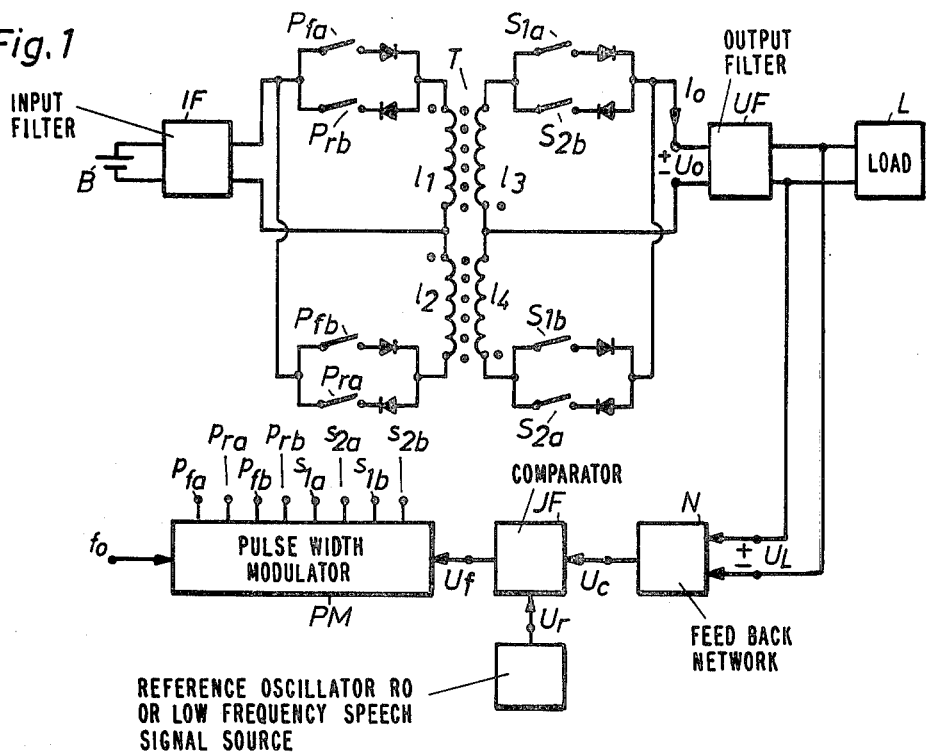
FIG. 1 is a block diagram of the basic features of a power amplifier in accordance with the invention.

The basic features of the power amplifier in accordance with the invention are apparent from FIG. 1. A battery B, with a suitable direct voltage is connected to an input filter IF. The outputs of the filter IF are connected to both terminals of a first winding $L_1$ of a transformer T. The input filter IF has the task of eliminating the disadvantages occurring when the supply voltage source of the amplifier does not have sufficiently low impedance at the switching frequency. The filter will smooth the pulse flows occurring in the amplifier so that other equipment (connected to the battery B) is not disturbed, and so that the supply voltage of the amplifier is not notably affected by these pulsed currents. The transformer T is of conventional implementation with a ferrite core, and contains two windings $L_1$ and $L_2$ on the battery side, and two windings $L_3$, $L_4$ on the load side. The winding $L_1$ has one end terminal connected via a first pair of switches $P_{fa}$, $P_{rb}$ to the filter output according to the above, and the winding $L_2$ has one end point connected via a second pair of switches $P_{fb}$, $P_{ra}$, and its second end point directly connected to the output of an input filter IF. In a similar way, the secondary winding half $L_3$ has one end point connected via a third pair of switches $S_{1a}$, $S_{2b}$, and its second end point directly connected to the input of an output filter UF. The fourth winding half $L_4$ has one end point connected via a fourth pair of switches $S_{1b}$, $S_{2a}$, and its second end point directly connected to the input of the output filter UF. The switches are controllable or steerable from the outputs $P_{fa}$, $P_{fb}$, $P_{ra}$, $P_{rb}$, $S_{1a}$, $S_{1b}$ by a pulse width modulator PM, which will be described in detail below. Each of the switches $P_{fa}$, $P_{ra}$, $P_{rb}$ and $S_{1a}$, $S_{1b}$, $S_{2a}$, $S_{2b}$ may be bipolar transistors, field effect transistors of the MOS type or bipolar type, depending on the application in question. The winding halves $L_1$–$L_4$ are oriented as indicated by the dot markings in FIG. 1, and the ratio of the number of turns $L_1$-$L_3$, $L_2$-$L_4$ can be selected in a suitable manner depending on the desired output voltage level of the load voltage $U_L$ obtained from the output filter UF. The block L symbolizes a load which, in line circuit application, constitutes a subscriber line with associated connected telephone sets.

The output of the output filter UF is connected, apart from being connected to the load, to the input of the feedback network N, which in its simplest form consists of a conductor. The output from the network N is connected to one input of a comparator JF, which can be an operation amplifier. A reference oscillator RO is connected to the other input of the comparator JF. The former sends a reference signal or an input signal, which it is desired to amplify over the amplifier output, i.e., over the output of the filter UF. In the application under consideration, the oscillator RO is omitted and the signal $U_r$ is a low frequency speech signal which is to be amplified in the amplifier.

In the comparison of the input voltage $U_r$ with the output voltage $U_c$ from the network N there is obtained an error voltage $U_f$ at the output of the comparator JF. This output is connected to the pulse width modulator PM, to give control signals at eight outputs $P_{fa}$, $P_{ra}$, $P_{fb}$, $P_{rb}$, $s_{1a}$, $s_{1b}$, and $s_{2a}$, $s_{2b}$, these signals being such that the switch pairs ($P_{ra}$, $P_{fb}$), ($P_{rb}$, $P_{fa}$), ($S_{1a}$, $S_{2b}$) and ($S_{2a}$, $S_{1b}$) are energized, as will be seen from the time diagram according to FIG. 2. The magnitude of the error voltage $U_f$ will determine in the pulse width modulator PM the pulse rate of the signals consisting of square waves on the outputs $P_{fa}$, $P_{ra}$, $P_{fb}$, $P_{rb}$ and $s_{1a}$, $s_{2a}$, $s_{1b}$, $s_{2b}$. The utilization of the control signals at the outputs $p_{fa}$, $p_{fb}$ may possibly not be needed, as shown by the embodiment according to FIG. 3. The pulse width of the control signals can vary from 0–100%, but their frequency is kept constant and determined by the frequency $f_o$ of a clock signal.

In the embodiment of the amplifier according to what is set forth below, there have been formed two like switching steps (a and b) by the doubled-up switches in each direction, which magnetize the transformer T in each direction for better utilizing the core material (so-called push-pull connection). By connecting the a and b steps; switching devices $P_{ra}$ and $P_{fb}$ etc, counter-directed, the same result can be achieved as if the transformer contained eight windings instead of the four illustrated in FIG. 1.

Since transformer effect is utilized in the transformer T, a low-impedance circuit shall be connected to the battery side at the switching frequency $f_o$, and a high-impedance circuit on the load side. This has been accomplished in the amplifier of FIG. 1 by a capacitive input on the input filter IF and an inductive input on the output filter UF.

Steering the amplifier and its operational modes will now be more closely described with reference to the time diagram according to FIG. 2.

At the time $t_o$ the switch $P_{fa}$ is energized and is conductive during an interval $t_o-t'$. During the next part $t'-t_1$ of the half clock pulse period $t_o-t_1$, the switch $P_{fa}$ is blocked and the switch $P_{ra}$ is conductive. During the same half of the clock pulse period $t_o-t_1$ the switch $S_{1a}$ on the load side is conductive while the switch $S_{2a}$ is blocked. Remaining switches on both battery and load sides are blocked during the period $t_o-t_1$. During the two phases 1 and 2 (the period $t_o-t_1$) the first switching step (the a step) of the amplifier is energized.

During the second half $t_1-t_2$ of the period the switch $p_{fb}$ is energized and is conductive for the time $t_1-t'$ and the switch $P_{rb}$ conductive for the time $t'-t_2$. Furthermore, the switch $S_{1b}$ is energized for conductivity during the whole period $t_1-t_2$. Remaining switches are thereby blocked. As long as the current $I_o$ to the output filter UF is positive (as in FIG. 1) the following takes place during each clock period:

| Phase | Conductive switch | | Energy transfer direction | $U_o$ | $I_o$ |
|---|---|---|---|---|---|
| 1 | $P_{fa}$ | $S_{1a}$ | Input filter→Output filter | positive | positive |
| 2 | $P_{ra}$ | $S_{1a}$ | Input filter←Output filter | negative | positive |
| 3 | $P_{fb}$ | $S_{1b}$ | Input filter→Output filter | positive | positive |
| 4 | $P_{rb}$ | $S_{1b}$ | Input filter←Output filter | negative | positive |

During two phases 1 and 2 of the clock pulse period, the "a step" is energized and the output filter charged during phase 1 and discharged during phase 2, as will be seen from the shape of the curve for the current $I_o$, where the ripple has been exaggerated for the sake of clarity. The pulse width modulation controls the relationship between the duration of phase 1 and phase 2, and thereby the net energy transport between input and output filters IF and UF. During the next clock pulse period (phases 3 and 4) the "b step" executes the same function with the difference that the transformer T is magnetized in the opposite direction to maintain flux balance.

When the current $I_o$ to the output filter UF is negative, the sequence during a clock pulse period will be as follows:

| Phase | Conductive switch | | Energy transfer direction | $U_o$ | $i_o$ |
|---|---|---|---|---|---|
| 11 | $P_{rb}$ | $S_{2b}$ | Input filter←Output filter | positive | negative |
| 12 | $P_{fb}$ | $S_{2b}$ | Input filter→Output filter | negative | negative |
| 13 | $P_{ra}$ | $S_{2a}$ | Input filter←Output filter | positive | negative |
| 14 | $P_{fa}$ | $S_{2a}$ | Input filter→Output filter | negative | negative |

During one period of the current $I_o$ to the output filter UF, the a and b switching steps are energized during half a clock pulse period each, and are energized alternatingly in time with the double clock pulse frequency since $t_o-t_1=t_1-t_2=\ldots=\frac{1}{2}f_o$, pulse width modulation taking place within these time intervals. During phases 1 and 3 the positive current $I_o$ increases, while it decreases during the phases 2 and 4. If the pulse width modulation is such that the time for the phases 2 and 4 increases more than for the phases 1 and 3, the current $I_o$ will eventually change sign. This will then happen during phase 2 or 4. The pulse width modulator PM will give a steering pulse to the switches $P_{fa}$ and $S_{2a}$ (shortly before the time $t_o'$ in FIG. 2) when $I_o$ changes sign from + to −, whereby the current $I_o$ is taken from one input of the output filter through the closed switch $S_{2a}$, the transformer winding $l_4$ and back again to the output filter UF. During the first half of the clock pulse period $t_o'-t_1'$ the switches $P_{rb}$, $P_{fb}$ and $S_{2b}$ will be energized, and during the second half $t_1'-t_2'$ the switches $P_{ra}$, $P_{fa}$ and $S_{2a}$ will be energized. Synchronous operation and continuous current is thus ensured if phase 2 (or 4) is interrupted, when the current $I_o$ becomes $=0$, whereon phase 12 (or phase 14 as in FIG. 2) immediately takes over and continues until the time at which phase 2 (or 4) should have ended.

Figure 2:
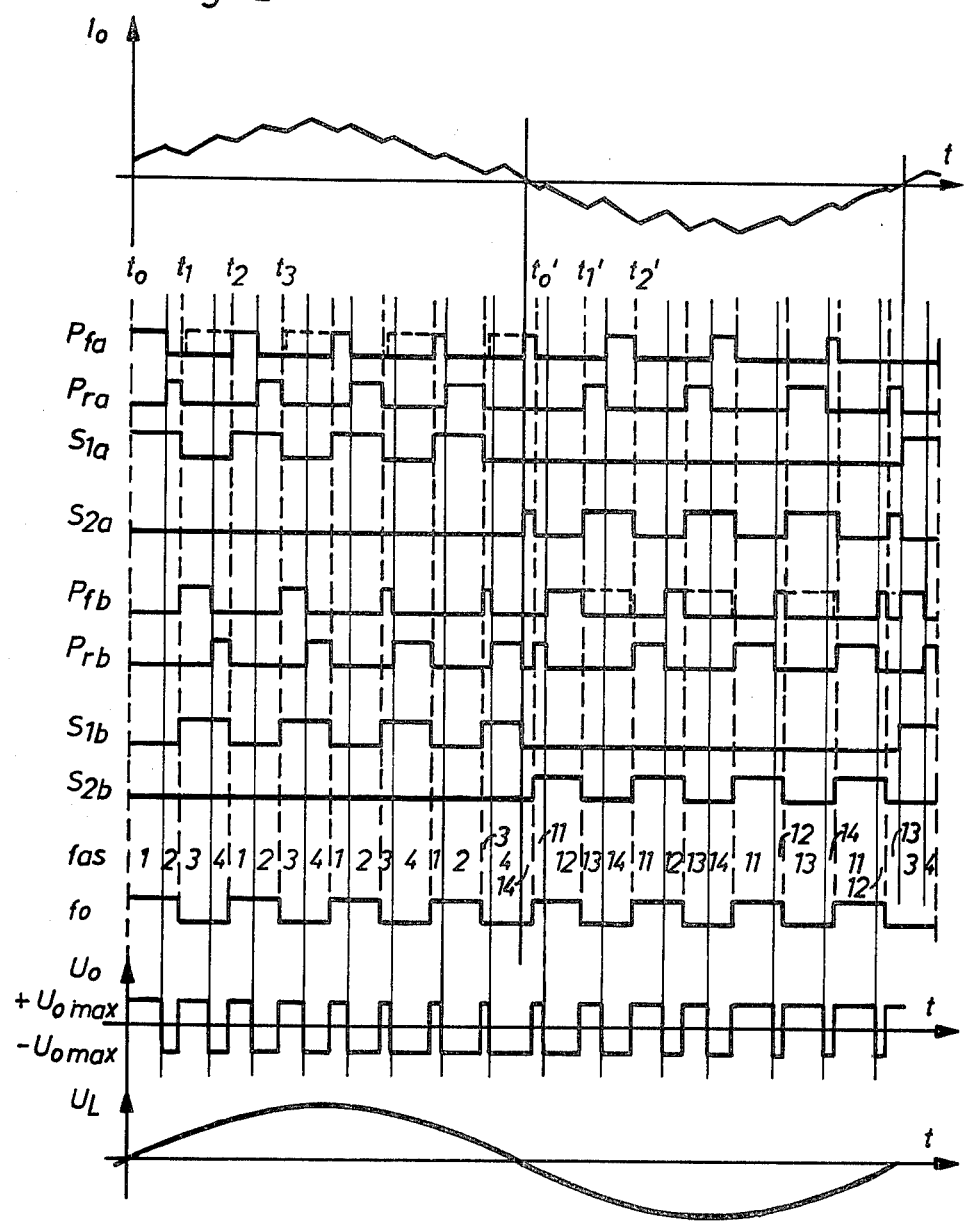
FIG. 2 is a time diagram for more fully explaining the function of the amplifier in FIG. 1.

By allowing the pulse width modulator PM, analogous with the above, to control the switch $P_{rb}$ conductive to $P_{fa}$ conductive from phase 11 to phase 1, and the switch $P_{ra}$ conductive to the switch $P_{fb}$ conductive from phase 13 to phase 3, a positive current $I_o$ is obtained after the zero pass after it has previously been negative (not shown in FIG. 2).

Figure 3:
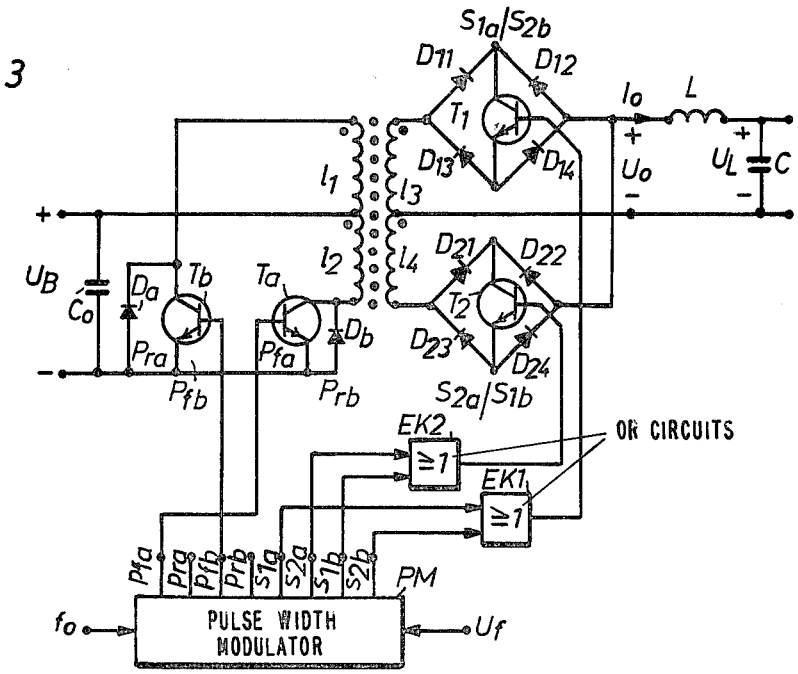
FIG. 3 is a circuit diagram of an advantageous embodiment of the invention in accordance with the invention.

An advantageous embodiment of the power step of the amplifier according to FIG. 1 is illustrated in FIG. 3, where the feed-back loop has been excluded for the sake of simplicity (the same as in FIG. 1). The capacitor $C_o$ forms the input filter IF, while the choke L and capacitor C form the output filter UF. Both switches $P_{ra}$, $P_{rb}$ have been replaced by the diodes $D_a$ and $D_b$. The switches $P_{fa}$ and $P_{fb}$ are transistors $T_a$ and $T_b$, which are thus controlled from the output $P_{ra}$ and $P_{rb}$ of the pulse width modulator PM. The control pulses from both these outputs may be seen from FIG. 2. On the load side, both switches $S_{1a}$, $S_{2b}$ are formed by the diode bridge $D_{11}$–$D_{14}$ and the transistor $T_1$, and both switches $S_{2a}$, $S_{1b}$ are formed by the diode bridge $D_{21}$–$D_{24}$ and the transistor $T_2$. The transistor $T_1$ is controlled by pulses from the output of an OR circuit EK1, both inputs of which are connected to the control pulse outputs $s_{1a}$ and $s_{2b}$ of the pulse width modulator PM. In a similar manner, the transistor $T_2$ is controlled by the pulse from the OR circuit EK2, both inputs of which are connected to the pulse width modulator PM control pulse outputs $s_{2a}$ and $s_{1b}$.

The time diagram of FIG. 2 is thus applicable to the amplifier of FIG. 3 even if the outputs $p_{fa}$ and $p_{fb}$ are not utilized. The diodes $D_a$ and $D_b$, corresponding to the switches $P_{ra}$ and $P_{rb}$, conduct current and are blocked during the same interval as the switches $P_{ra}$ and $P_{rb}$.

During the first part of the half clock pulse period $t_o$–$t_1$ according to FIG. 2 (phase 1), the transistor $T_a$ is conductive ($P_{fa}$ is conductive) as well as the transistor $T_1$. Current then flows from the battery minus pole. By the transformer action, the magnetized transformer drives a current through the winding $l_3$, diode $D_{11}$, transistor $T_1$ and the diode $D_{14}$ to the choke L to charge it. During the remaining part of the interval $t_o$–$t_1$ (phase 2) the transistor $T_a$ is blocked ($T_b$ is blocked), current from the battery therefore flowing from its minus pole through the diode $D_a$ into the winding $L_1$ and back again to its plus pole. This gives a discharge current from the choke L to the diodes $D_{12}$, transistor $T_1$, diode $D_{13}$ and through the winding $L_3$. During phase 3, the transistor $T_b$ becomes conductive and a current flows from the battery plus pole through the winding $L_1$ and transistor $T_b$ to the battery minus pole. The transformer $T_1$ is magnetized and gives a current through the winding $l_4$, diode $D_{21}$, transistor $T_2$ (which is now conductive) diode $D_4$ and through the choke L, which is charged. The same thing happens in principle during phase 4 as during phase 2, i.e. since both transistors $T_a$ and $T_b$ are blocked and since the transistor $T_2$ is conductive, the choke will be discharged with a current $I_o$ through the diodes $D_{22}$, $D_{23}$ and the winding $l_4$, a current on the battery side flowing through the diode $D_b$ and winding $l_2$ from the battery minus pole to its plus pole.

To simplify the construction of the pulse width modulator PM, control or steering pulses can advantageously sent also during the time intervals $t_1$–$t_2$, $t_3$–$t_4$ etc. to the switch $P_{fa}$, i.e. the transistor $T_a$ in the embodiment according to FIG. 3, although this switch does not then conduct any current. This gives the advantage that the current $I_o$ changes sign, which takes place when the choke L is discharged during phase 2 or 4, when the transistor $T_a$ ($P_{fa}$) is normally blocked, but is brought into a conductive state when $I_o=0$. By control pulses being sent to it during phase 4 already, the conductive condition in phase 14 can be prepared, i.e. before circuit $I_o$ becomes $=0$. In a simpler mode, the transistor $T_b$ ($P_{fb}$) can be prepared for its conductive state in phase 3 by control pulses being sent to the transistor $T_b$ during phase 13 (when $I_o<0$). The control pulses for both these cases have been shown in FIG. 2 by dashed lines.

What I claim is:

1. In a pulse width modulated power amplifier for converting, in response to a controlling input signal, a direct voltage to a low-frequency output signal from zero Hz to a given upper limiting frequency and with a voltage amplitude which is not limited to the level of said direct voltage, the amplifier including a pair of input terminals for connection of the direct voltage, a pair of output terminals for connection to a load and a transformer with four windings, a first and a second controllable switch connected to the end points of the windings on the direct voltage input side of the transformer, a third and a fourth controllable switch connected to the end points of the windings of the transformer load side to form a first converter step, and a pulse width modulater adapted for steering the switches in response to an error signal derived from said output signal and said controlling input signal corresponding to the desired alternating voltage, so that during a first time interval first and second controllable switches are steered to alternating conductive and blocked states with a given pulse rate in response to the magnitude of said error signal, and the third and fourth switches are steered to conductive and blocked states during said time interval, the improvement comprising fifth and sixth switches connected in parallel with said first and said second switches on the direct voltage input side, and with reverse conducting direction, seventh and eighth switches connected in parallel with said third and fourth switches on the load side, and with reverse conducting direction to form a second switching stage, said pulse width modulator being adapted for steering, in response to said error signal during a second time interval subsequent to said first time interval, the fifth and sixth switches to alternating conductive and blocked conditions with a given pulse rate in response to the size of said error signal and also for steering the seventh and eighth switches on the load side to conductive and blocked conditions during said second time interval and said first switch, on the battery side, being adapted to be steered to a conductive state even during at least a part of said subsequent second time interval when said output signal is positive.

2. Amplifier according to claim 1 further comprising means for generating a clock signal of given frequency for applying to said pulse width modulator, said first and second time interval and subsequent time intervals each constituting one-half of a clock pulse interval.

3. In a pulse width modulated power amplifier for converting, in response to a controlling input signal, a direct voltage to a low-frequency output signal from zero Hz to a given upper limiting frequency and with a voltage amplitude which is not limited to the level of said direct voltage, the amplifier including a pair of input terminals for connection of the direct voltage, a pair of output terminals for connection to a load and a transformer with four windings, a first and a second controllable switch connected to the end points of the windings on the direct voltage input side of the transformer, a third and a fourth controllable switch connected to the end points of the windings of the transformer load side to form a first converter step, and a pulse width modulater adapted for steering the switches in response to an error signal derived from said output signal and said controlling input signal corresponding to the desired alternating voltage, so that during a first time interval the first and the second controllable switches are steered to alternating conductive and blocked states with a given pulse rate in response to the magnitude of said error signal, and the third and fourth switches are steered to conductive and blocked states during said time interval, the improvement comprising fifth and sixth switches connected in parallel with said first and said second switches on the direct voltage input side, and with reverse conducting direction, seventh and eighth switches connected in parallel with said third and fourth switches on the load side, and with reverse conducting direction to form a second switching stage, said pulse width modulator being adapted for steering, in response to said error signal during a second time interval subsequent to said first time interval, the fifth and sixth switches to alternating conductive and blocked conditions with a given pulse rate in response to the size of said error signal and also for steering the seventh and eighth switches on the load side to conductive and blocked conditions during said second time interval said seventh switch, on the load side, being adapted to be steered to a conductive state during at least a part of said subsequent time interval when said output signal is negative.

4. Amplifier according to claim 3 further comprising means for generating a clock signal of given frequency for applying to said pulse width modulator, said first and said second time interval and subsequent time intervals each constituting one-half of a clock pulse interval.

* * * * *